United States Patent [19]
Scholder et al.

[11] Patent Number: 5,452,184
[45] Date of Patent: Sep. 19, 1995

[54] MULTI-POSITION PC BOARD FASTENER WITH GROUNDING ELEMENT

[75] Inventors: Erica Scholder, Austin; Kevin Troy, Bryan; Karl Steffes, Austin, all of Tex.

[73] Assignee: Dell USA, L.P., Austin, Tex.

[21] Appl. No.: 425,672

[22] Filed: Apr. 18, 1995

Related U.S. Application Data

[63] Continuation of Ser. No. 179,806, Feb. 22, 1994, abandoned.

[51] Int. Cl.6 .......................... F16B 19/00; H05K 7/12
[52] U.S. Cl. ...................................... 361/799; 361/804; 411/508; 24/297; 24/305; 24/343; 439/95
[58] Field of Search ........ 361/785, 799, 801, 802–804; 174/138 D, 138 E, ; 411/508; 24/297, 305, 343, 346–347; 439/65, 74, 95

[56] References Cited

U.S. PATENT DOCUMENTS

| | | | |
|---|---|---|---|
| 4,495,548 | 1/1985 | Matsui | 361/804 |
| 4,527,312 | 7/1985 | Ruehl et al. | 361/804 |
| 4,938,703 | 7/1990 | Nakano | 361/804 |
| 4,969,065 | 11/1990 | Petri | 361/804 |
| 5,191,513 | 3/1993 | Sugiura et al. | 361/752 |

*Primary Examiner*—Bot L. Ledynh
*Attorney, Agent, or Firm*—Michael Heim; James Huffman

[57] ABSTRACT

A fastener for securing a printed circuit board to a chassis includes a body portion, legs depending from the body portion, the legs being adapted for removable attachment within holes in the chassis, a hook for slidably engaging a slot on a printed circuit board inserted thereon, and a grounding element for providing an electrical connection between the printed circuit board and a shield on the chassis. The fastener described herein enables one chassis design to accommodate a variety of sizes of printed circuit boards merely by forming holes at particular points on the chassis, thereby avoiding the expense of redesigning a chassis to accommodate a new printed circuit board.

15 Claims, 6 Drawing Sheets

MULTI-POSITION PC BOARD FASTENER WITH GROUNDING ELEMENT

This is a continuation application of co-pending U.S. patent application Ser. No. 08/179,806 filed Feb. 22, 1994, now abandoned.

BACKGROUND OF THE INVENTION

The present invention relates generally to computers and other electronic assemblies comprising printed circuit boards, and more particularly, to apparatus for affixing printed circuit boards within computer and other electronic assemblies. Still more particularly, the present invention relates to a printed circuit board fastener that, with only minor effort, may be positioned anywhere within the chassis of a computer and another electronic assembly.

Computer and other electronic assemblies typically include one or more printed circuit (PC) boards that support electronic components. Commonly, PC boards are secured within a steel or plastic chassis for an electronic assembly by means of screws extending through holes in the PC board and threadedly engaged to a portion of the chassis.

Although this manner of attachment is reliable, it has several disadvantages. First, installation of a PC board by means of screws is a very labor-intensive operation. Holes must be bored in the PC board. Corresponding female-threaded holes or receptacles must be installed in the chassis. The PC board must be aligned in the proper position, and the screws must be rotated into place. In addition, the screws and other materials are relatively costly, and the chassis, having been adapted to receive a particular size PC board, is not readily adaptable to PC boards of other sizes.

The assignee of the present invention has used an alternative PC board mounting technique by which vertically-extending plastic hooks are molded into the base of a plastic chassis. The hooks are received through slots formed in a PC board as the PC board, lying in a horizontal plane, is lowered onto the base of the chassis. After the PC board is seated on the chassis, with hooks extending through slots, the PC board is displaced horizontally to engage the hooks on the upper surface of the PC board at one end of the slots, thereby preventing vertical motion of the PC board. Thereafter, a small plastic catch mechanism is snapped into engagement with an edge of the PC board to prevent horizontal motion.

Like the method of attachment that relies on screws, the latter method of attachment works well, but is limited to a particular size of PC board for which the chassis has been especially adapted.

Manufacturers of computer and other electronic apparatus constantly improve their products. These improvements frequently include the addition of greater computing capacity and features in ever smaller and lighter weight packages. As a result, computer manufacturers constantly face the problem of repackaging PC boards of different, usually smaller, sizes. Designing and manufacturing a new chassis mold is a significant expense, particularly if it must be done each time a new PC board is designed. With a PC board mounting technique that depends upon features molded into the chassis base, such as hooks or receptacles for screws, the manufacturer has no alternative but to absorb the expense and redesign the chassis.

Hence, it would be advantageous to devise a PC board mounting apparatus that is relatively inexpensive, as well as easy to install and de-install, and that can be positioned anywhere within the chassis without significant mechanical modification, thereby enabling the chassis to accommodate PC boards of a variety of sizes without redesign of the chassis.

SUMMARY OF THE INVENTION

Accordingly, there is provided herein a fastener for mounting a printed circuit (PC) board within a chassis, including a body portion, a plurality of leg members depending from a lower surface of said body portion for removably attaching the fastener to the chassis, a hook for slidably embracing the PC board, and a grounding element for forming an electrically conductive path between the PC board and the chassis. Each leg member preferably includes at the base thereof a foot member that can be received through a hole in the chassis to engage the underside of the chassis.

The hook preferably includes an arm member extending upwardly from an upper surface of the body portion and a catch member extending generally perpendicularly from the arm member. The catch member can be received through a slot in the PC board to hold the PC board in place. The grounding element preferably includes an electrically conductive metallic band that fits snugly around the body portion to form a sound electrical connection, upon assembly of the fastener with the PC board and the chassis, between the underside of the PC board and the chassis.

A fastener made in accordance with the principles of the present invention is inexpensive to manufacture and relatively easy to install and de-install by comparison with the prior art techniques currently in use. In addition, it has the advantage of enabling a single chassis to accommodate PC boards of a variety of sizes without redesign or significant mechanical modification of the PC board or the chassis. These and other characteristics and advantages of the present invention will become readily apparent to those skilled in the art upon reading the following detailed description and claims and by referring to the accompanying drawings.

BRIEF DESCRIPTION OF THE DRAWINGS

For a more detailed description of the preferred embodiment of the invention, reference will now be made to the accompanying drawings, wherein.

DESCRIPTION OF THE PREFERRED EMBODIMENT

Figure 1:
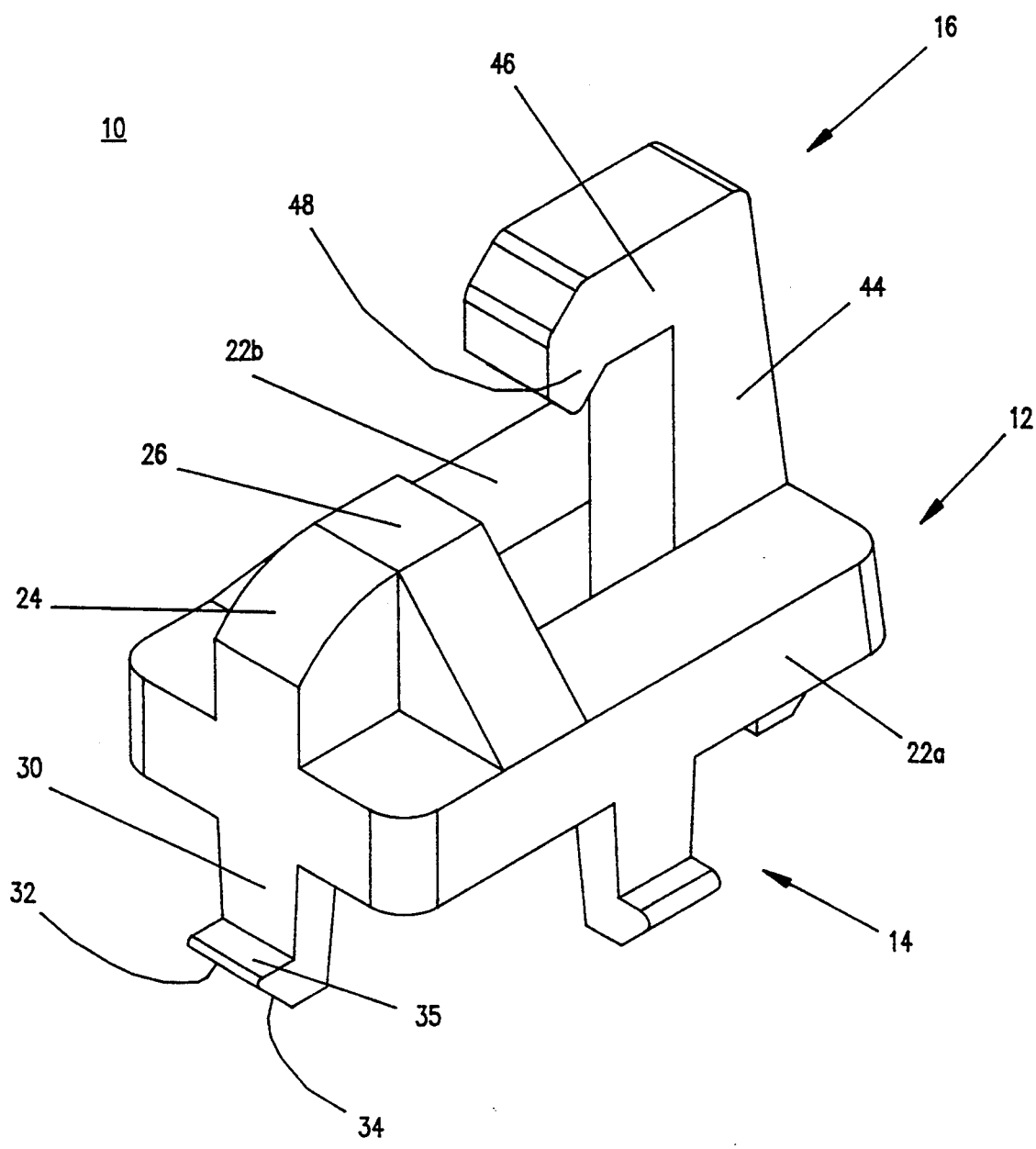
FIG. 1 is a perspective view of a fastener constructed in accordance with the principles of the present invention for mounting a printed circuit board within a chassis.

Current apparatus for securing printed circuit (PC) boards within a chassis include attachment by screws and by fixed-position, molded-in hooks, each of which fit through slots in the PC board. Neither method of attachment readily permits use of PC boards of different sizes without redesign or significant mechanical modification of the chassis. In accordance with the principles of the present invention, there is provided herein a PC board fastener that can accommodate any of a variety of PC board sizes without significant mechanical modification to the chassis.

In addition, proper grounding and EMI shielding are important considerations in the design of any computer or other electronics package. Typically, computer manufacturers either use a metal chassis to which the electronics system is grounded or provide a conductive shield, such as an integral wire mesh molded within a plastic chassis or a metalized paint coating, on the interior of a molded plastic chassis. A good electrically conductive path between the chassis shield and the ground trace on a PC board is important to insure proper operation of the electronics. The present invention, in addition to providing a more versatile fastener, also includes a grounding element that insures a good electrical connection between the PC board and the shield embodied by the chassis, whether the chassis is constructed of plastic or metal.

Referring now to FIGS. 1–4, a PC board fastener 10 constructed in accordance with the principles of the present invention includes a body portion 12, a plurality of leg members 14, a hook 16, and a grounding element 18.

Figure 2:
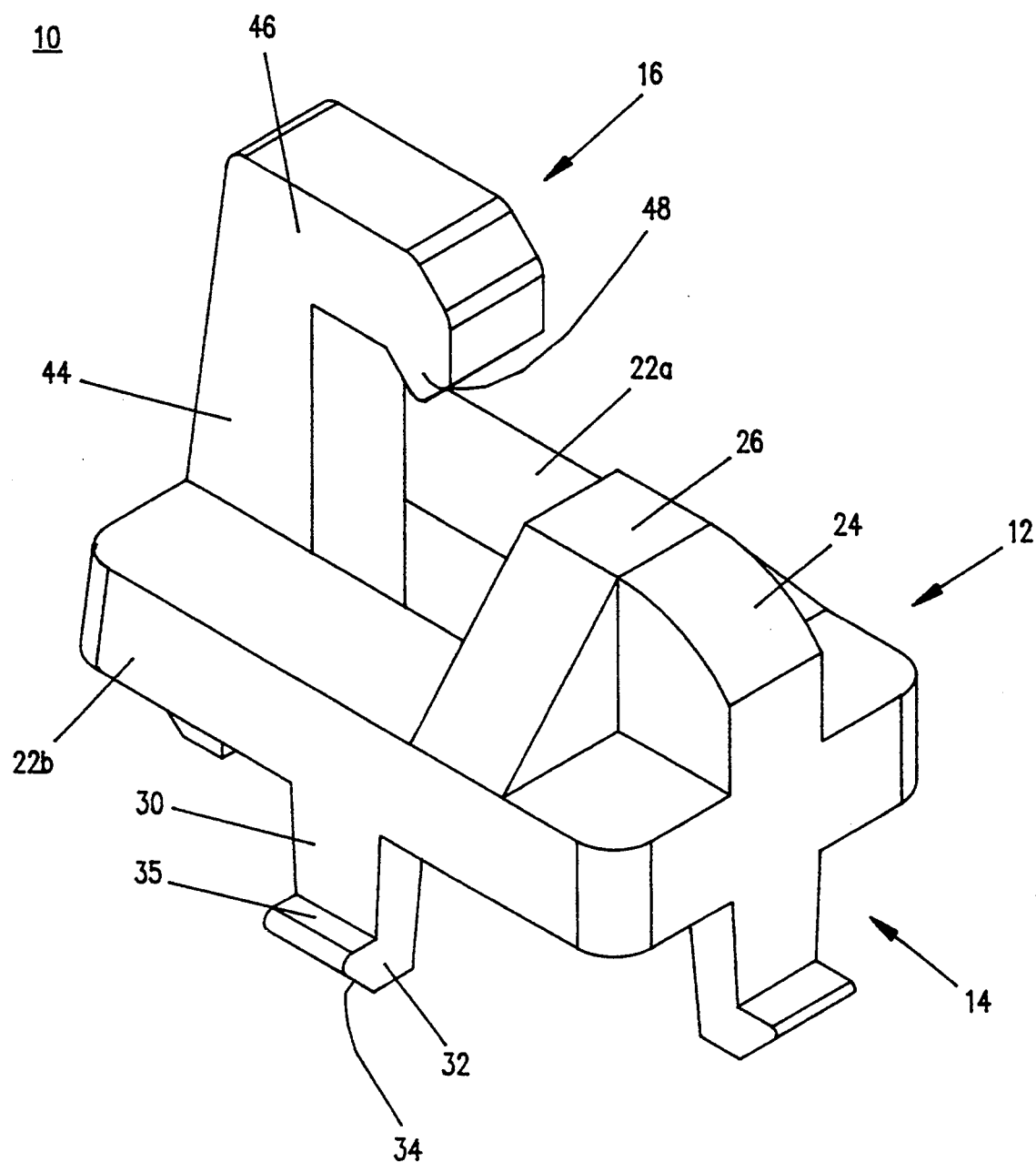
FIG. 2 is a second perspective view of the fastener depicted in FIG. 1.

The body portion 12 includes a pair of generally parallel, elongated members 22a,b adjoined at a forward end of the fastener 10 by a printed circuit board support element 24. The support element 24 includes an upwardly facing surface 26 for supporting a PC board. Although the preferred configuration for the support element 24 is depicted in FIGS. 1 and 2, the support element may be of any configuration so long as it spaces the upwardly facing support surface 26 a sufficient distance away from the chassis (not shown) to provide a desired spacing between the underside of the PC board and the chassis. Such desired spacing will vary depending on the nature of the PC board. In addition, the support element 24 must accommodate the grounding element 18, as described in detail hereafter.

Four leg members 14 depend from the lower face of the body portion 12. Each leg member 14 includes an elongated member 30 and a foot member 32. Each foot member 32 includes a chamfered edge 34 that facilitates attachment of the fastener to the chassis (not shown) and a locking surface 35 that engages the underside of the chassis upon installation of the fastener 10.

Figure 5:
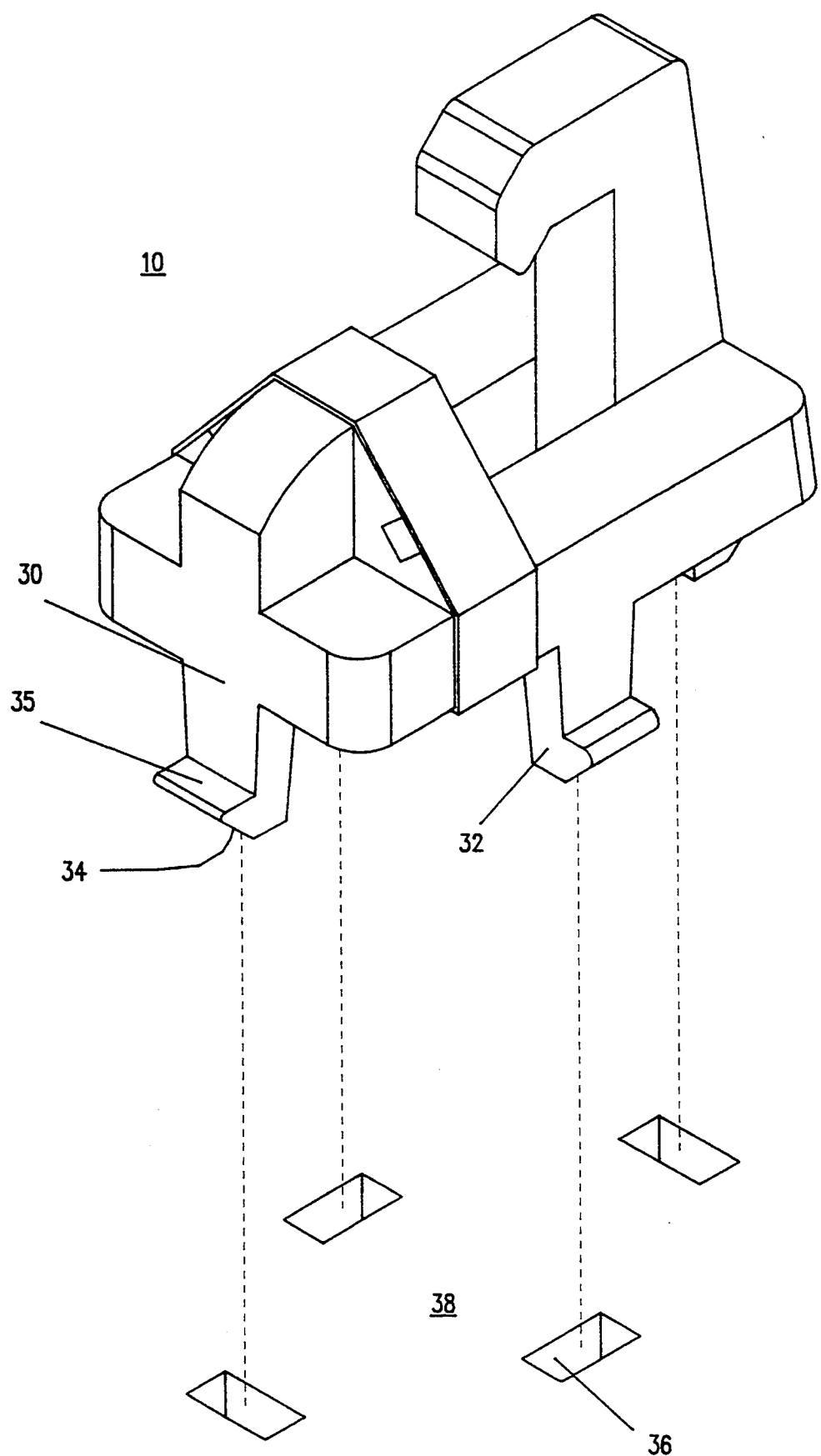
FIG. 5 is a perspective view of the fastener shown in FIG. 4 aligned with the base of a chassis to demonstrate the method of installation of the fastener on the chassis.

FIG. 5 depicts the fastener 10 aligned with four holes 36 in the base of the chassis 38. The fastener 10, including the leg members 14, but excluding the grounding element 18, preferably is injection molded of a plastic resin such as polycarbonate/acrylonitrile-butadiene styrene ("PC/ABS"), which is sold commercially by General Electric Plastics under the trademark "CYCOLOY" and by Mobay Chemicals under the trademark "BAYBLEND." Use of this or a similar plastic resin will permit the elongated member 30 to flex slightly as the foot member 32 is pressed into the corresponding hole 36 in the chassis 38. The length of each elongated member 30, as measured from the lower face of the body portion 12 to the locking surface 35, corresponds roughly to the thickness of the chassis. When the foot members 32 are pressed into the corresponding holes 36 in the chassis 38, the locking surface 35 then engages the underside of the chassis, holding the fastener 10 snugly in place.

Referring again to FIGS. 1 and 2, the hook comprises an arm member 44 and a catch member 46. The arm member 44 extends upwardly from the rearward end of the body portion 12. The catch member 46 projects forwardly from the upper end of the arm member 44 in the direction of the support element 24. The catch member 46 includes at its forward end a downwardly extending protuberance 48 for engaging the upper face of the PC board, as described in more detail below.

Figure 3:
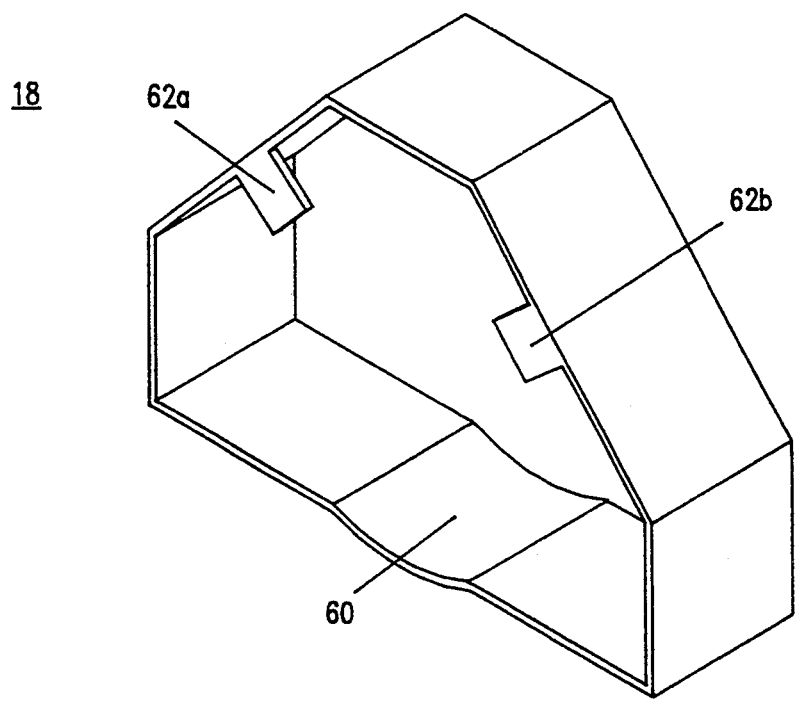
FIG. 3 is a perspective view of a grounding element for installation on the fastener depicted in FIG. 1.
Figure 4:
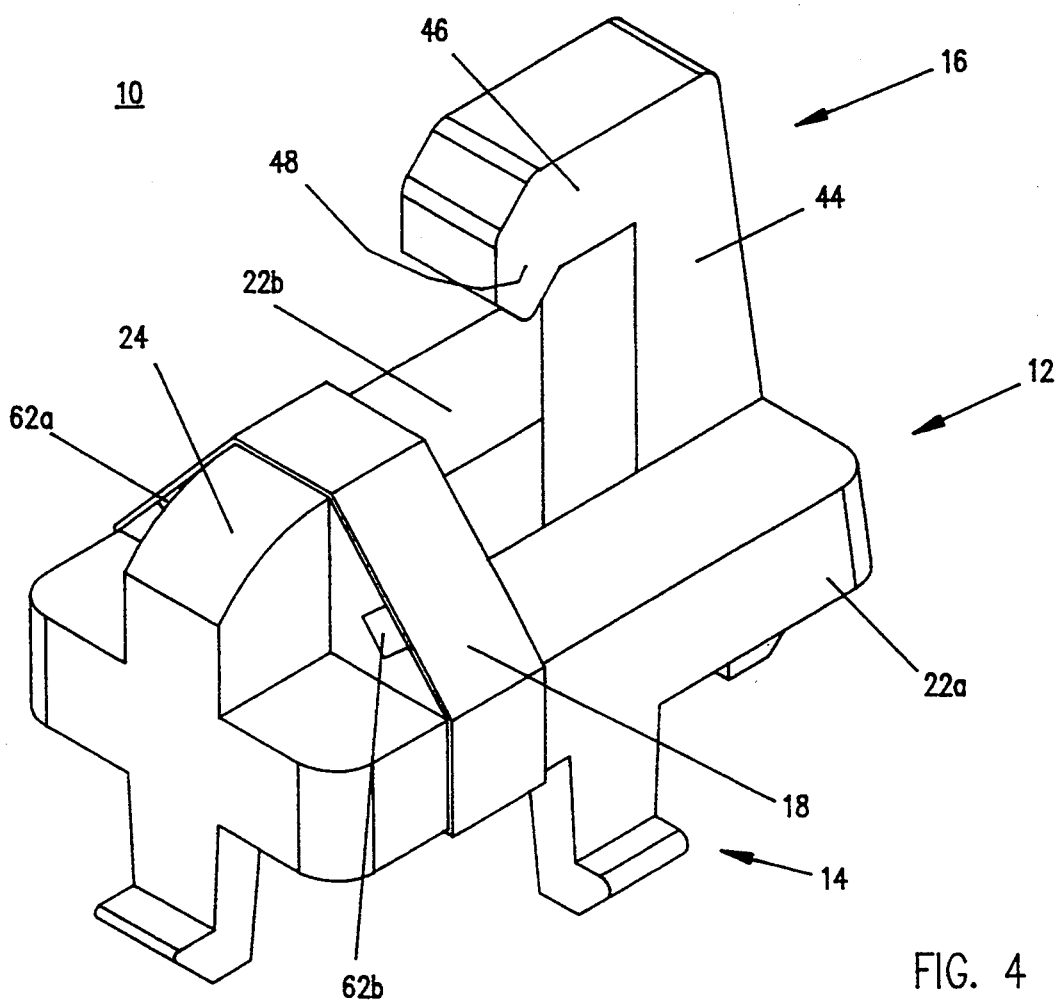
FIG. 4 is a perspective view of the fastener depicted in FIG. 1 with the grounding element shown in FIG. 3 installed thereon.

Referring now to FIGS. 3 and 4, the grounding element preferably comprises a band of cold-rolled or stainless steel shaped to conform to the periphery of the body portion 12 at the point of the support element 24. The grounding element 18 includes a deformation 60 on the lower surface thereof and a pair of alignment tabs 62a,b.

Figure 6:
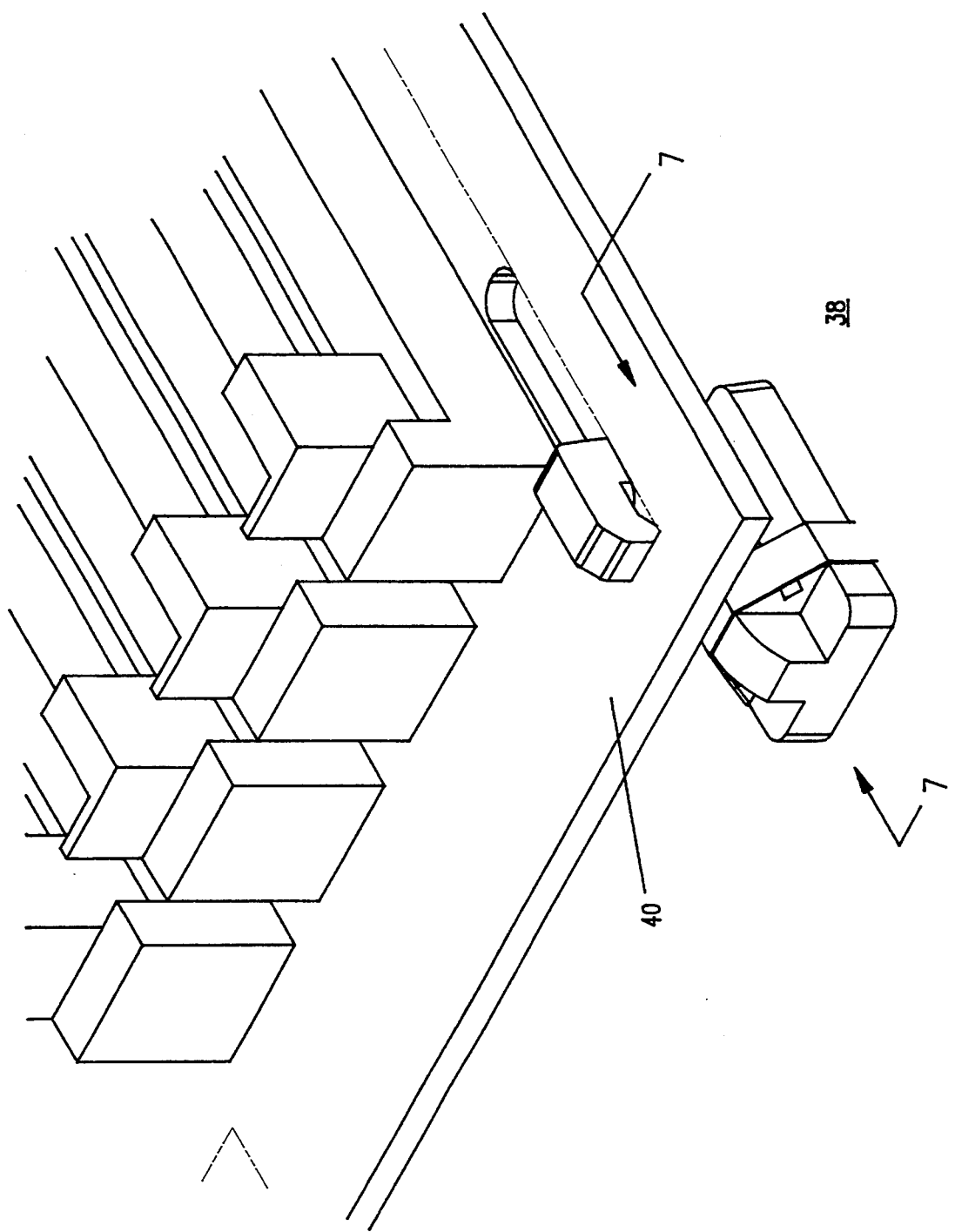
FIG. 6 is a perspective view of the fastener of FIG. 4 secured to a chassis and engaging a printed circuit board.

The deformation 60, on installation of the fastener 10 onto the chassis 38 as shown in FIGS. 5 and 6, functions as a loaded spring, biasing the grounding element 18 against the chassis to insure a good electrical connection between the chassis 38 and the PC board 40. With use of the deformation 60, manufacturing tolerances on the fastener are not as critical as they otherwise would be, and typical variations in chassis wall thickness do not frustrate the effort to maintain a good electrical connection.

The alignment tabs 62a,b engage an edge on the support element 24 when the grounding element 18 is installed on the body portion 12, insuring that the grounding element 18 is properly positioned on the fastener 10.

Figure 7:
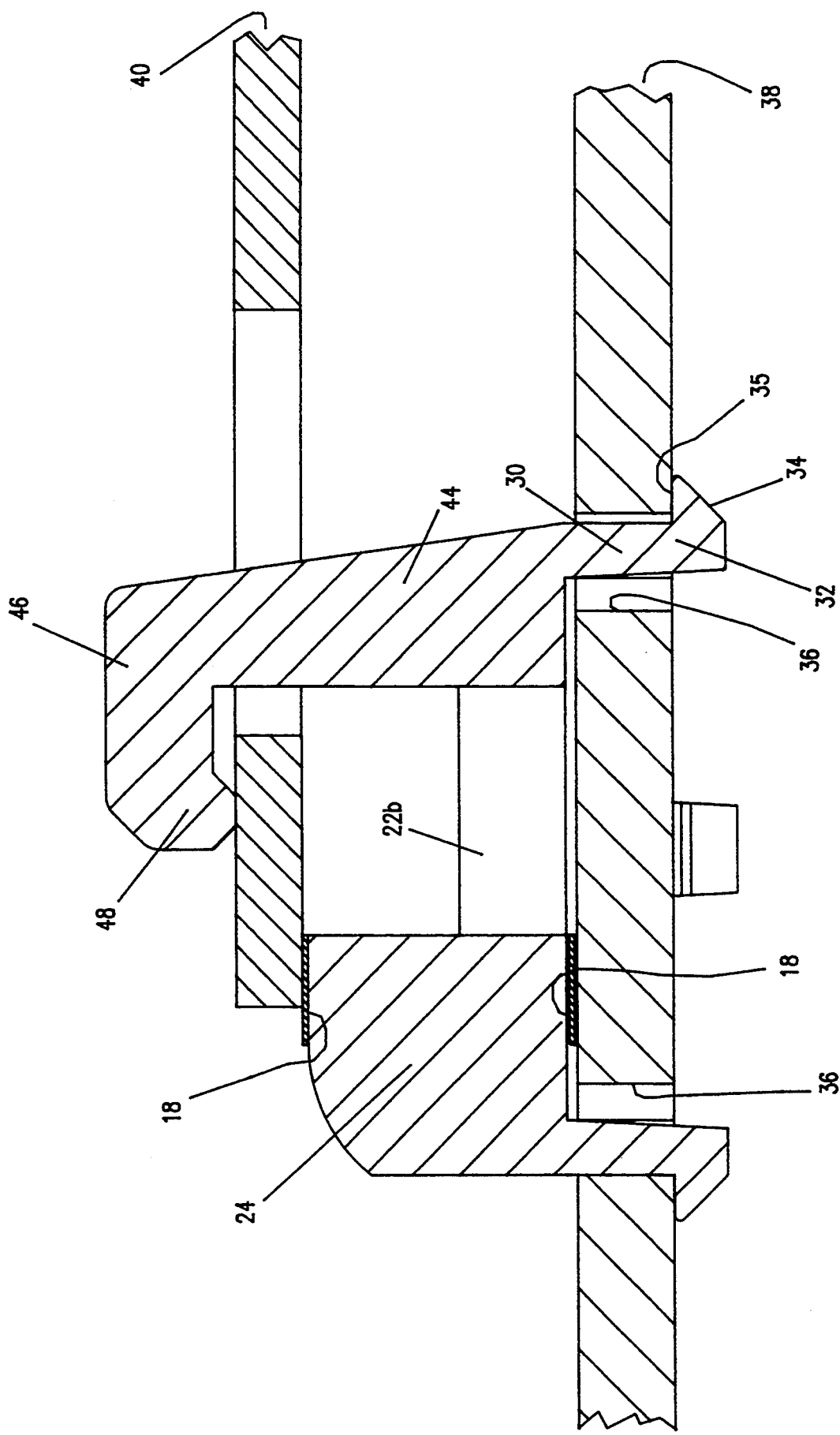
FIG. 7 is a cross-sectional view taken along a line 7—7 as shown in FIG. 6.

Referring now to FIGS. 5–7, the fastener 10 is installed on the chassis 38 by aligning the foot members 32 with the holes 36 in the chassis 38 and pressing the foot members 32 through the holes 36. The holes 36 preferably are positioned so that the leg members 30, after installation within the holes 36, remain slightly biased against the sidewall of the holes 36, whereby the fastener 10 is held firmly on the chassis 38.

The PC board 40, with a slot 42, then is lowered vertically onto the fastener 10, with the catch member 46 being received through the slot 42. When the lower face of the PC board 40 seats on the grounding element 18, the PC board is moved horizontally to the rear, causing the protuberance 48 on the forward end of the catch mechanism 46 to engage the upper surface of the PC board 40 and hold the PC board 40 against the grounding element 18.

One having skill in the art will appreciate that the foregoing description of attributes and advantages to be experienced in constructing the apparatus described herein is not exhaustive of all features of the present invention. It will be appreciated that modifications for the aforedescribed preferred embodiment of the invention can be made without departing in substance from the principles of the invention. For example, the precise configuration of the body portion 12 of the fastener 10 is not critical to the proper operation of the invention, so long as the fastener of an alternative embodiment has the attributes described herein.

What is claimed is:

1. A fastener for attaching a printed circuit board to a chassis, comprising:
   a body portion having a first surface for supporting thereon the printed circuit board and a second surface for engagement with the chassis;
   a plurality of leg members extending from said body portion for removably attaching said fastener to the chassis, wherein said plurality of leg members include a foot member which is insertable into an aperture in said chassis to engage said chassis; and
   a hook for slidably embracing a first surface on the printed circuit board and holding an opposing surface of the printed circuit board against said body portion.

2. A fastener according to claim 1, further comprising a grounding element forming an electrically conductive path between the first and second surfaces of said body portion.

3. A fastener according to claim 2, wherein each leg member of said plurality of leg members comprises:
   an elongated member having a first end and a second end, the first end of said elongated member being affixed to the second surface on said body portion and extending away therefrom; and
   said foot member protruding generally perpendicularly from the second end of said elongated member.

4. A fastener according to claim 3, wherein said elongated member on each leg member of said plurality of leg members is flexible, whereby said foot member may be displaced relative to said body portion for insertion through a hole in the chassis.

5. A fastener according to claim 4 wherein said foot member on each leg member of said plurality of leg members extends outwardly relative to said body portion.

6. A fastener according to claim 2, wherein said hook comprises:
   an arm member having a first end and a second end, said arm member being affixed at the first end thereof to said body portion and extending therefrom beyond the first surface thereof; and
   a catch member extending generally perpendicularly from the second end of said arm member,
   whereby said catch member may be received through a slot in the printed circuit board to embrace the first surface of the printed circuit board and hold the opposing surface thereof against the first surface of said body portion as the printed circuit board is displaced generally perpendicularly relative to said arm member.

7. A fastener according to claim 2 wherein said grounding element comprises a conductive metallic band that fits around said body portion, including the first and second surfaces thereof, whereby upon installation of the printed circuit board within the chassis using said fastener, said metallic band forms a conductive path between the printed circuit board and the chassis.

8. A fastener according to claim 7 wherein said grounding element is deformed along a portion thereof, whereby upon installation of said fastener on the chassis, the deformed portion of said grounding element biases said grounding element against the chassis.

9. A fastener for releasably securing a printed circuit board having an upper face and a lower face and a slot formed therein to a chassis having an upper face and a lower face and a plurality of holes formed therein, comprising:
   a frame having an upper face and a lower face;
   a printed circuit board support element on the upper face of said frame, said support element including an upwardly facing surface for supporting the lower face of the printed circuit board;
   a plurality of legs extending generally downwardly from the lower face of said frame, each leg of said plurality of legs having an upper end and a lower end, the lower end thereof being adapted for extension through and locking within a hole in the chassis;
   a printed circuit board clasp on the upper face of said frame, said clasp being adapted for extension through and slidable engagement within the slot in the printed circuit board; and
   a grounding clip forming an electrically conductive connection between the printed circuit board support surface on said support element and the lower face of said frame.

10. A fastener according to claim 9 wherein said frame comprises a pair of elongated, generally parallel, horizontally disposed members defining at one end thereof a front end and at the opposite end thereof a rear end.

11. A fastener according to claim 10 wherein said support element connects between said elongated, parallel members of said frame at the front end thereof.

12. A fastener according to claim 11 wherein each leg of said plurality includes on the lower end thereof a hook, whereby the leg may be extended through one of the holes in the chassis to engage the lower face of the chassis.

13. A fastener according to claim 12 wherein said printed circuit board clasp connects said elongated, parallel members of said frame at the rear end thereof and comprises:
   a first member extending upwardly from said frame;
   a second member extending forwardly from the upper end of said first member, generally parallel to said frame; and
   a third member extending generally downwardly from the forward end of said second member, said third member being positioned above the upwardly facing surface on said support element,
   whereby said clasp may be extended through the slot in the printed circuit board and moved forwardly relative to the slot to cause the printed circuit board to be engaged between said third member of said clasp and the upwardly facing surface on said support element.

14. A fastener according to claim 13 wherein said grounding clip comprises a conductive metallic band about said support element and said frame.

15. A fastener according to claim 14 wherein said fastener, other than said grounding clip, is injection molded of a plastic material.

* * * * *